United States Patent [19]

Pankove

[11] Patent Number: 4,862,471

[45] Date of Patent: Aug. 29, 1989

[54] SEMICONDUCTOR LIGHT EMITTING DEVICE

[75] Inventor: Jacques I. Pankove, Boulder, Colo.

[73] Assignee: University of Colorado Foundation, Inc., Boulder, Colo.

[21] Appl. No.: 185,601

[22] Filed: Apr. 22, 1988

[51] Int. Cl.$^4$ .......................... H01S 3/19; H01L 33/00
[52] U.S. Cl. ........................................... 372/45; 357/4; 357/17; 357/61
[58] Field of Search ................... 357/17, 4, 61; 372/45

[56] References Cited

U.S. PATENT DOCUMENTS

| | | | |
|---|---|---|---|
| 3,683,240 | 8/1972 | Pankove | 357/17 |
| 3,740,622 | 6/1983 | Pankove et al. | 357/17 |
| 4,268,842 | 5/1981 | Jacob et al. | 357/17 |
| 4,396,929 | 8/1983 | Ohki et al. | 357/17 |
| 4,408,217 | 10/1983 | Kobayashi et al. | 357/17 |
| 4,608,581 | 8/1986 | Bagratishvili et al. | 357/17 |
| 4,759,024 | 7/1988 | Hayakawa et al. | 357/17 |

*Primary Examiner*—William L. Sikes
*Assistant Examiner*—Georgia Y. Epps
*Attorney, Agent, or Firm*—Earl C. Hancock; Donald S. Cohen

[57] ABSTRACT

A semiconductor, injection mode light emitting device includes a body of a semiconductor material having a quantum mode region formed of alternating layers of gallium nitride and either indium nitride or aluminum nitride. A region of N-type gallium nitride is on one side of the quantum well region and is adapted to inject electrons into the quantum mode region. A region of P-type gallium phosphide is on the other side of the quantum well region and is adapted to inject holes into the quantum mode region. A barrier region of insulating gallium nitride is between the P-type region and the quantum well region and serves to block the flow of electrons from the quantum well region into the P-type region. Conductive contacts are provided on the N-type region and the P-type region.

11 Claims, 1 Drawing Sheet

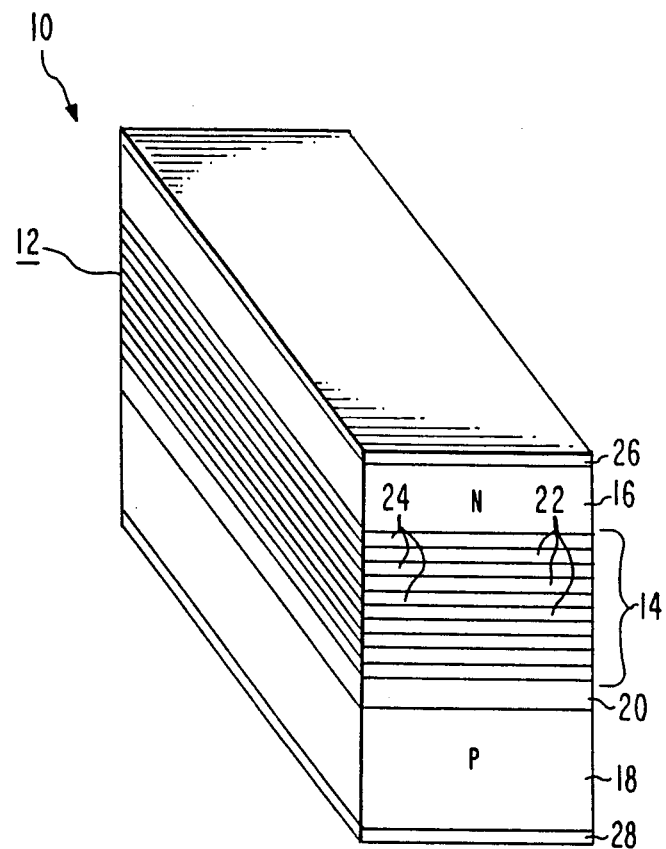

SEMICONDUCTOR LIGHT EMITTING DEVICE

FIELD OF THE INVENTION

The present invention relates to a semiconductor light emitting device, and, more particularly to a short wavelength, injection light emitting semiconductor device.

BACKGROUND OF THE INVENTION

Semiconductor light emitting devices, such as light emitting diodes and laser diodes, include a body of a semiconductor material, generally a group III-V material or a combination of III-V materials, having spaced contacts which allow a current to be passed through the body. Light is generated in the body and can be emitted either from a top or bottom surface of the body, or from an end surface of the body. Laser diodes have a resonator cavity built into the body which creates substantially coherent light which is generally emitted from an end surface of the body. A relatively efficient type of semiconductor light emitting device operates in an injection mode. Such devices include regions of opposite conductivity type with a PN junction therebetween. In such a device, electrons are generated in the N-type region and are injected across the junction into the P-type region where they combine with holes to generate light. The composition of the material used to make the device determines the wavelength of the light emitted from the device.

Gallium nitride (GaN) has been used to make light emitting devices which emit light at different wavelengths, including short wavelengths (visible to ultraviolet). The structures of some light emitting devices which are made of GaN are shown in U.S. Pat. No. 3,683,240 to J. I. Pankove, entitled ELECTROLUMINESCENT SEMICONDUCTOR DEVICE OF GAN, issued Aug. 8, 1972 and U.S. Pat. No. 3,740,622 to J. I. Pankove et al, entitled ELECTROLUMINESCENT SEMICONDUCTOR DEVICE FOR GENERATING ULTRA VIOLET RADIATION, issued June 19, 1973. However, a problem with GaN is that it cannot be made highly conductive P-type. Therefore, it has been difficult to make an injection mode light emitting device from gallium nitride.

SUMMARY OF THE INVENTION

An injection mode light emitting device includes a body of a semiconductor material having a quantum well region with opposed sides which is adapted to receive both injected electrons and injected holes and which emits light upon the recombination of the electrons and holes. A region of N-type gallium nitride is on one side of the quantum well region and is adapted to inject electrons into the quantum well region. A region of a narrower gap P-type semiconductor material is on the other side of the quantum well region and is adapted to inject holes into the quantum well region. A barrier region is between the P-type region and the quantum well region for blocking the flow of electrons from the quantum well region into the P-type region so that the recombination of the electrons and holes and the generation of light take place in the quantum well region.

Those having normal skill in the art will recognize the foregoing and other objects, features, advantages and applications of the present invention from the following more detailed description of the preferred embodiments as illustrated in the accompanying drawings.

BRIEF DESCRIPTION OF THE DRAWING

The Figure of the drawing is a perspective view of a form of the light emitting device of the present invention.

DETAILED DESCRIPTION OF PREFERRED EMBODIMENTS

Referring to the drawing, a form of the semiconductor light emitting device of the present invention is generally designated as 10. The light emitting device 10 includes a substantially rectangular body 12 of a semiconductor material. The body 12 includes a quantum well region 14, a N-type electron injection region 16 on one side of the quantum well region 14, a P-type hole injecting region 18 on the other side of the quantum well region 14, and a barrier region 20 between the P-type region from 18 and the quantum well region 14 to block electrons from passing from the quantum well region 14 into the P-type region 18.

The quantum well region 14 is made up of a plurality of alternating layers 22 and 24 of gallium nitride (GaN) and either indium nitride (InN) or aluminum nitride (AlN) respectively. The GaN and InN layers are each of a thickness of between 20 and 60 angstroms and there are between 1 and 100 of such layers in the quantum well region 14. The N-type region 16 is of undoped gallium nitride. The P-type region 18 is a narrower band gap material, such as gallium phosphide (GaP). The barrier region 20 is of gallium nitride which is doped with zinc to make it insulating, and is of a thickness of between 200 and 500 angstroms.

Conductive contacts 26 and 28 are on the surfaces of the N-type region 16 and P-type region 18 respectively. The contacts 26 and 28 are made of an electrically conductive material which makes good ohmic contact and adheres well to its respective region of the body 12. For example, the contact 26 to the gallium nitride N-type region 16 may be made of indium or aluminum, and the contact 28 to the gallium phosphide P-type region 18 may be made of a gold-zinc alloy. For a light emitting device 10 which emits light from its top or bottom surface, the appropriate contact 26 and 28 must be either transparent to the wavelength of the emitted light or cover only a portion of its respective surface of the body 12 so that the light can be emitted therefrom. For a light emitting device 10 which emits light from an end surface, the contacts 26 and 28 can cover the entire area of their respective surfaces. For an injection laser, the sides of the body 12 are structured to form a Fabry-Perot optical cavity as is well known in the art.

To make the light emitting device 10, one starts with a substrate of P-type gallium phosphide which in the finished device serves as the P-type region 18. The gallium nitride barrier region 20, the layers 22 and 24 of the quantum well region 14, and the N-type gallium nitride region are then deposited on the substrate in sequence, such as by vapor phase epitaxy, molecular beam epitaxy or by any other well known epitaxial deposition technique for these materials. The gallium nitride may be deposited by the vapor phase epitaxy technique described in the article "The Preparation and Properties of Vapor-Deposited Single-Crystalline GaN" by H. P. Maruska and J. J. Tietjen published in APPLIED PHYSICS LETTERS, Volume 15, page 327 (1969.) The N-type gallium nitride is undoped and the insulating gallium nitride is deposited with an acceptor impurity such as zinc in an amount sufficient to compensate substantially all of the native donors inherently formed in the gallium nitride. The indium nitride or aluminum nitride layers are deposited by a similar technique except that an indium containing gas, such as trimethyl indium or indium chloride or an aluminum containing gas, such as trimethyl aluminum, is used instead of the gallium containing gas. The contacts 26 and 28 are applied by evaporation in a vacuum.

In the light emitting device 10 of the present invention, the quantum well region 14 which comprises the alternating layers of gallium nitride and either indium nitride or aluminum nitride, can be adjusted to provide quantized state for electrons that are at a preselected level in the range of 1.9 to 3.4 eV above the valence band. Although there is a 10% mismatch between the gallium nitride and indium nitride lattice constants, it is possible to generate a stable strained layer structure. The N-type gallium nitride region 16 is a very conducting wide gap semiconductor that serves as a good injector of electrons into the quantum well region 14. Although gallium nitride cannot be made P-type conducting because the acceptors are very deep and the N-vacancies form compensating donors, it is possible to use the narrower gap P-type gallium phosphide to inject holes into the quantum well region 14. However, the insulating gallium nitride region 20 is required as a barrier to prevent the flow of electrons from the quantum well region 14 into the P-type region 18. Thus, there is provided by the present invention, an injection mode light emitting device using gallium nitride which emits light having a short wavelength.

While the exemplary preferred embodiments of the present invention are described herein with particularity, those having normal skill in the art will recognize various changes, modifications, additions and applications other than those specifically mentioned herein without departing from the spirit of this invention.

What is claimed is:

1. An injection mode light emitting device comprising:
    a body of a semiconductor material having;
    a quantum well region having opposed sides and adapted to receive both injected electrons and holes and which emits light upon the recombination of the holes and electrons;
    a layer of N-type gallium nitride over one side of the quantum well region and adapted to inject electrons into the quantum well region;
    a layer of narrower band gap P-type semiconductor material over the other side of the quantum well region and adapted to inject holes into the quantum well region;
    a barrier layer between the P-type layer and the quantum well region for blocking the flow of electrons from the quantum well region into the P-type layer so that recombination of the electrons and holes and the generation of light takes place in the quantum well region; and
    conducting contacts on each of the N-type layer and the P-type layer.

2. A light emitting device in accordance with claim 1 in which the quantum well region is formed of alternating layers of gallium nitride and a nitride selected from the group consisting of indium nitride and aluminum nitride.

3. A light emitting device in accordance with claim 2 in which the layers of the quantum well region are each of a thickness of between 20 and 60 angstroms.

4. A light emitting device in accordance with claim 2 in which the quantum well region includes between 1 and 100 of the alternating layers.

5. A light emitting device in accordance with claim 2 in which the barrier layer is of insulating gallium nitride.

6. A light emitting device in accordance with claim 5 in which the barrier layer is of gallium nitride doped with zinc to make it insulating.

7. A light emitting device in accordance with claim 5 in which the barrier layer is of a thickness of between 200 and 500 angstroms.

8. A light emitting device in accordance with claim 5 in which the P-type layer is of gallium phosphide.

9. A light emitting device in accordance with claim 2 in which the body has a pair of opposite sides which form a Fabry-Perot cavity to make the device function as an injection laser.

10. A light emitting device in accordance with claim 2 in which the quantum well region is formed of alternating layers of gallium nitride and indium nitride.

11. A light emitting device in accordance with claim 2 in which the quantum well region is formed of alternating layers of gallium nitride and aluminum nitride.

* * * * *